United States Patent [19]

Jacobsen et al.

[11] 4,143,333

[45] Mar. 6, 1979

[54] IMPULSE NOISE REMOVING APPARATUS

[75] Inventors: Robert G. Jacobsen; Thomas H. Warner, both of Cambridge, Mass.; David P. Misunas, 24 Church St., Watertown, Mass. 02172

[73] Assignee: David P. Misunas, Cambridge, Mass.

[21] Appl. No.: 797,308

[22] Filed: May 16, 1977

[51] Int. Cl.² ............................................. H03F 1/26
[52] U.S. Cl. .................................. 330/149; 328/165; 328/167; 330/124 R
[58] Field of Search .................... 330/149, 124 R; 328/165, 167

[56] References Cited

U.S. PATENT DOCUMENTS

| | | | |
|---|---|---|---|
| 3,495,244 | 2/1970 | Rosa | 328/167 X |
| 3,569,852 | 3/1971 | Berkovitz | 330/149 X |
| 3,588,705 | 6/1971 | Paine | 328/165 X |
| 3,678,416 | 7/1972 | Burwen | 328/167 X |
| 4,038,539 | 7/1977 | Van Cleave | 328/167 X |

OTHER PUBLICATIONS

Cowley, "Self-Adaptive Filter", *IBM Technical Disclosure Bulletin*, vol. 12, No. 12, May 1970, pp. 2098-2099.

*Primary Examiner*—James B. Mullins
*Attorney, Agent, or Firm*—Morse, Altman, Oates & Bello

[57] ABSTRACT

In a noise reduction system of the type in which an audio signal is delayed in time to permit detection of and reaction to impulse noise before application of the audio signal to a loudspeaker or the like, a transformed version of the audio signal is compared with its time-averaged value, and a resulting detection signal is processed into a control signal with blanking periods that vary as a function of corresponding impulse noise. The detection produces a response to both large impulses which stand out from the audio signal and small impulses which are hidden in the audio signal. The control signal tailors its response to the size of the impulse, blanking the audio signal substantially only for the duration of the impulse. Auxilliary circuitry is provided.

29 Claims, 6 Drawing Figures

IMPULSE NOISE REMOVING APPARATUS

BACKGROUND OF THE INVENTION

Impulse noise in audio equipment, commonly referred to as "clicks" and "pops", can be caused by a number of factors, among them dust and scratches on the recording medium, static, and so forth. The removal of such noise has previously been a difficult problem due to its wide bandwidth, wide variation in amplitude, and the need to remove any such noise completely.

The prior art in this area has consisted primarily of devices which low pass filter, limit amplitude, limit slew rate, or blank the signal in the presence of impulse noise. Conventional audio equipment such as receivers and preamplifiers utilize low pass filters to limit the occurrence of impulse noise. This approach also limits the high frequency response of the system and at the same time only attenuates the impulse noise slightly. Automatic noise limiters, commonly used in vehicle radio equipment to remove ignition noise (a form of impulse noise) limit the signal excursion to a certain amplitude [1]. This method also only reduces the amplitude of the noise, in addition to greatly decreasing the dynamic range of a system in which it is used.

1. Myers, R., "The Radio Amateur's Handbook," American Radio Relay League, Newington, CT, 1976.

Systems designed specifically for the elimination of impulse noise generally operate in one of two manners [2]. First, such systems often take advantage of the rapid change in amplitude caused by an impulse and supress it by limiting the slew rate of the audio circuitry. However, high amplitude, high frequency signals are adversely affected by such a slew rate limitation.

2. Burwen, R. S., "A Dynamic Noise Filter," Journal of the Audio Engineering Society, Vol. 19, No. 2, February 1971.

The second approach to impulse noise limiting utilizes blanking circuits to eliminate the entire signal upon the detection of impulse noise. This approach does not adversely affect signal quality when no impulse noise is present; however, attempts to utilize the approach have not been effective in the complete elimination of an impulse and have not yielded the capability to handle wide variation in impulse duration.

The primary object of the present invention is to provide a critically improved time-delay system that is capable of separating impulse noise components, of both large and small size or energy, from the full range of audibly proper components of an audio signal. Generally, in combination with input retarding and output synchronizing circuits that enable detection and blanking of the undesired impulse noise components, the system comprises circuits, which: respond to the audio signal by producing a transformed signal having attenuated audibly proper components and intensified impulse noise components; respond to the transformed signal by producing an averaging signal characterized by instantaneous sizes that correspond to averaged sizes of predetermined time spans of the transformed signal; respond synchronously to the transformed signal and the averaging signal by producing a detection signal having specified components of sizes that vary functionally with sizes of the impulse noise components; and respond to the detection signal by producing a control signal having blanking components characterized by varying time spans that are functionally related to the sizes of the specified components.

Other objects of the present invention are to provide: filtration and differentation circuitry for generating the transformed signal; rectification circuitry for generating the averaging signal; comparison circuitry for generating the detection signal; and variable charge circuitry for generating the control signal.

A subsidiary object of the present invention is to control the slew rate during the blanking in the output synchronizing circuit in order to minimize introduction of noise as a consequence of operation of the system of the present invention.

In audio systems with more than one channel, the above circuitry is duplicated for each channel, although certain portions such as the impulse detection circuitry, the delay circuitry, and the blanking control circuitry may be shared between channels.

BRIEF DESCRIPTION OF THE DRAWINGS

For a fuller understanding of the nature and objects of the present invention, reference is to be made to the following description, which is to be taken in connection with the accompanying drawings, wherein.

DETAILED DESCRIPTION

Figure 1:
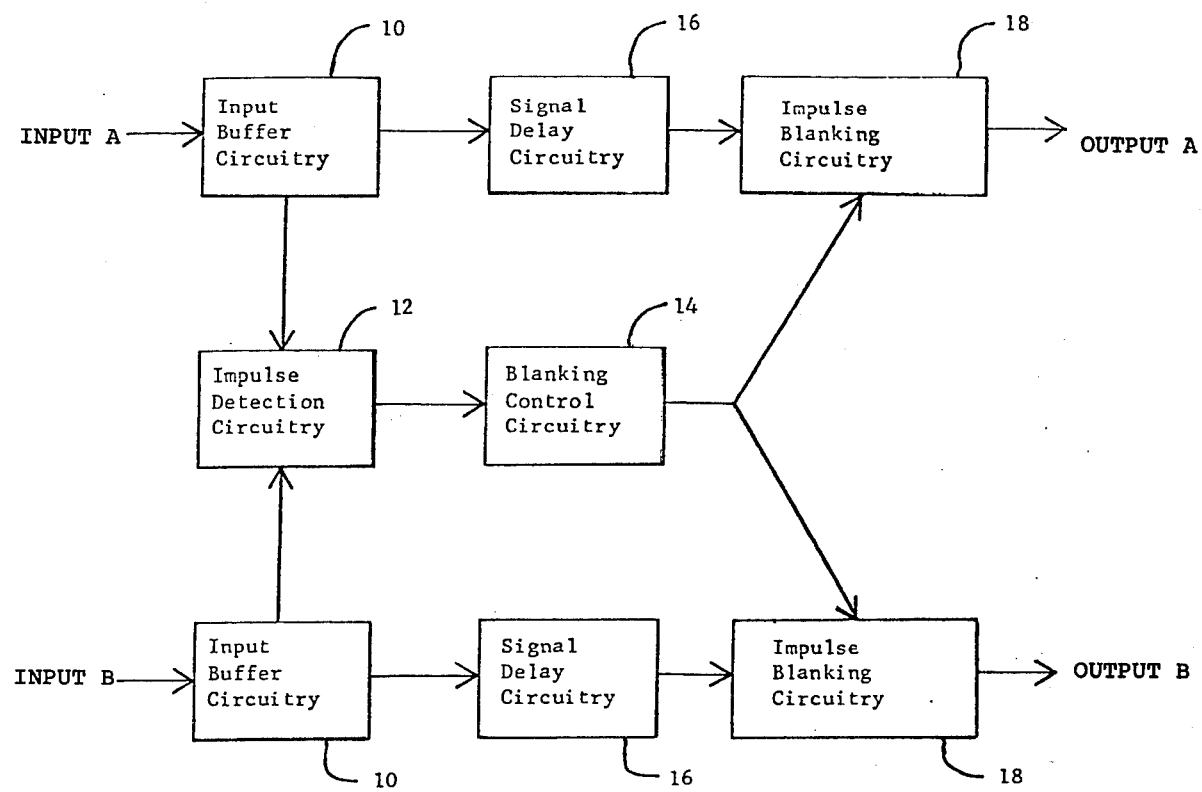
FIG. 1 is a general schematic of a system embodying the present invention.

Generally, the embodiment of FIG. 1 features input buffer circuitry 10 for buffering input signals, impulse detection circuitry 12 for the detection of impulse noise, blanking control circuitry 14 to control the response of the system to impulse noise, signal delay circuitry 16 to delay the input signal in time, and impulse blanking circuitry 18 to eliminate detected impulse noise from the signal.

In illustration of one embodiment of the invention, we describe below details of the components of the foregoing system.

The system of FIG. 1 operates by blanking the input signal in the presence of impulse noise. The impulse detection circuitry 12 detects impulse noise by constructing a full-wave receified version of the high-frequency components of the input signal and comparing that generated signal with its time-average value. Large excursions of the rectified version of the input signal above the average indicate the presence of impulse noise and cause the transmission of a detection signal to the blanking control circuitry 14. Upon receipt by the blanking control circuitry 14 of a detection signal from the impulse detection circuitry 12 indicating the presence of impulse noise, the blanking control circuitry 14 generates a blanking pulse, the length of which is an increasing function of the amplitude of the detected impulse noise.

The input signal is delayed at the signal delay circuitry 16 for a sufficient length of time to allow detection of an impulse. The delayed signal proceeds to the impulse blanking circuitry 18. The blanking pulse from the blanking control circuitry 14 commands the impulse blanking circuitry 18 to blank the input signal for the duration of a detected impulse. This blanking is accomplished through severe limitation of the slew rate of the signal. The slew-limited condition is entered and exited gradually, and the signal is low-pass filtered during the exiting of the slew-limited condition, preventing noise that would be generated by a discontinuity or a rapid change in the output signal level.

Figure 2:
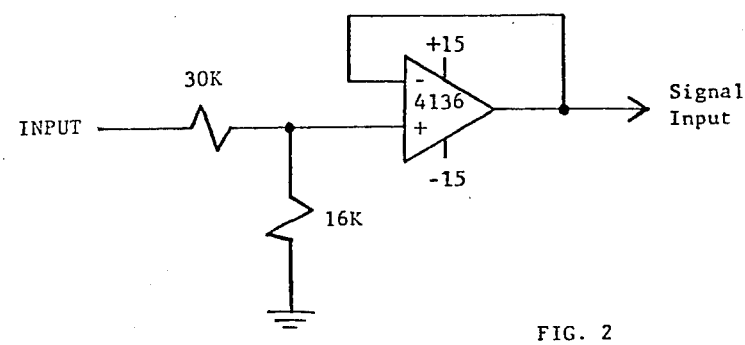
FIG. 2 is a general schematic of the input buffer circuitry of the embodiment of FIG. 1.

The input buffer circuitry is shown in FIG. 2. This circuit presents a 46 kilohm input impedance and attenuates the input by approximately a factor of 3, due to amplitude restrictions of the signal delay circuitry 16 utilized in the present embodiment. The attenuated signal is presented to a voltage follower which passes it to the impulse detection circuitry 12 and the signal delay circuitry 16.

Figure 3:
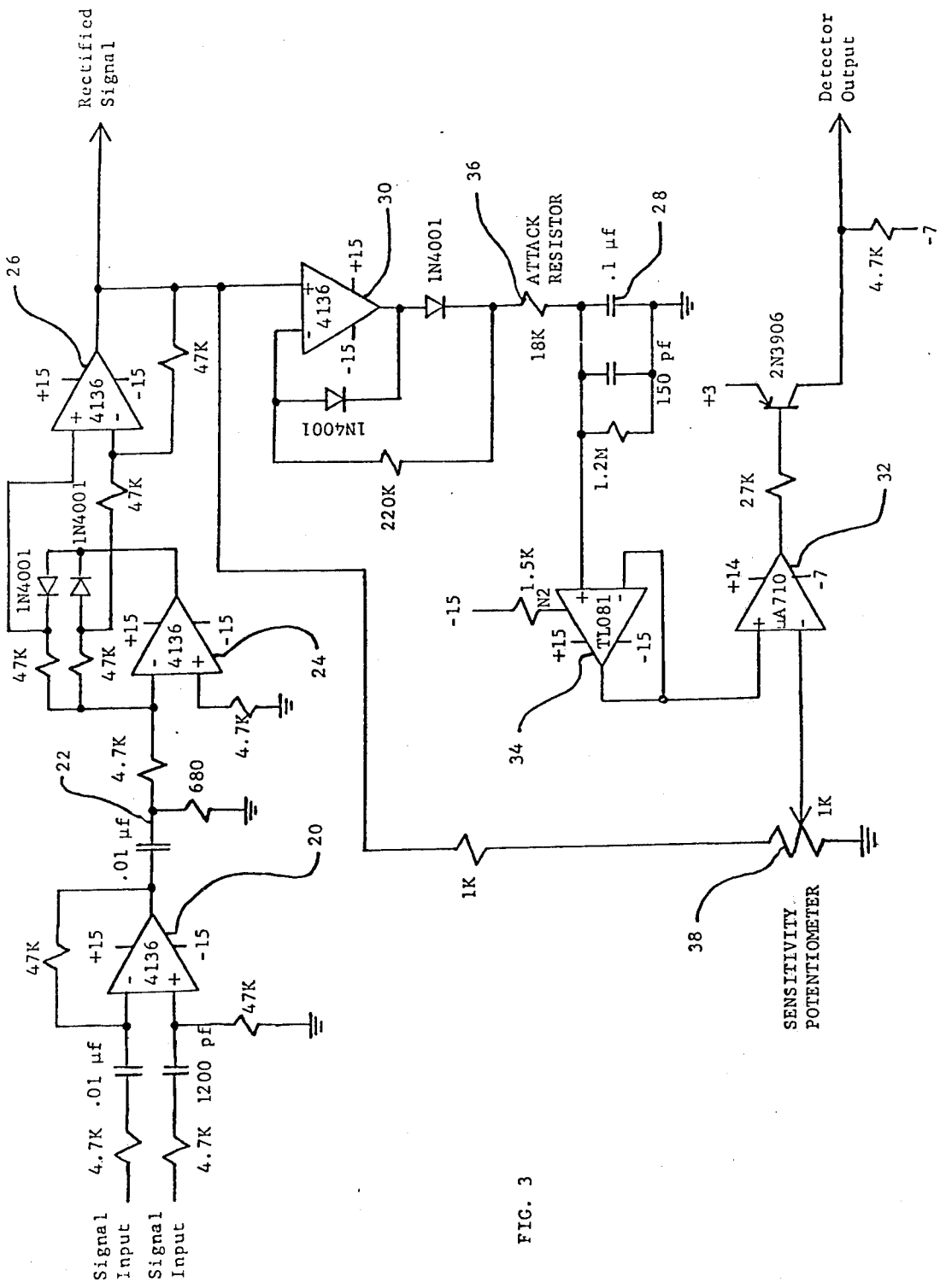
FIG. 3 is a general schematic of the impulse detection circuitry of the embodiment of FIG. 1.

The impulse detection circuitry 12 is shown in FIG. 3. The inputs from the two input channels of the present embodiment are subtracted at operational amplifier 20. RC combination 22, along with the RC combinations on the two inputs of operational amplifier 20 form a high-pass filter with two poles. One pole around 3 kilohertz serves to attenuate the low frequency portion of the signal, emphasizing any impulse noise. The second pole around 30 kilohertz causes the filter to function as a differentiator, highlighting the high slew rate of impulse noise.

In accordance with the present invention, the lower frequency pole is at from one kilohertz to ten kilohertz and the higher frequency pole is at 20 kilohertz or above. Operational amplifiers 24 and 26 and associated resistors, capacitors, and diodes form an absolute value circuit to fullwave rectify the filtered signal.

The time average value of the rectified signal is maintained on capacitor 28 by operational amplifier 30 and associated components which form an ideal diode. The signal on capacitor 28 is compared with the rectified signal produced by operational amplifier 26 at comparator 32. The non-inverting input of comparator 32 is buffered by JFET-input operational amplifier 34 to prevent dissipation of the charge on capacitor 28 through the bias current of comparator 32. JFET-input operational amplifier 34 has approximately a 20 millivolt offset, provided by means of a resistor connected to one of its offset null inputs. This offset holds the time-average value presented to comparator 32 above the noise, preventing false detection signals which could be generated either by low-level inputs or in the absence of an input. Attack resistor 36 controls the rate of charge transfer to capacitor 28; and hence, the rise time of the time-average value. Sensitivity potentiometer 38 controls the overrun above the time-average value required of an impulse before it is recognized.

Figure 4:
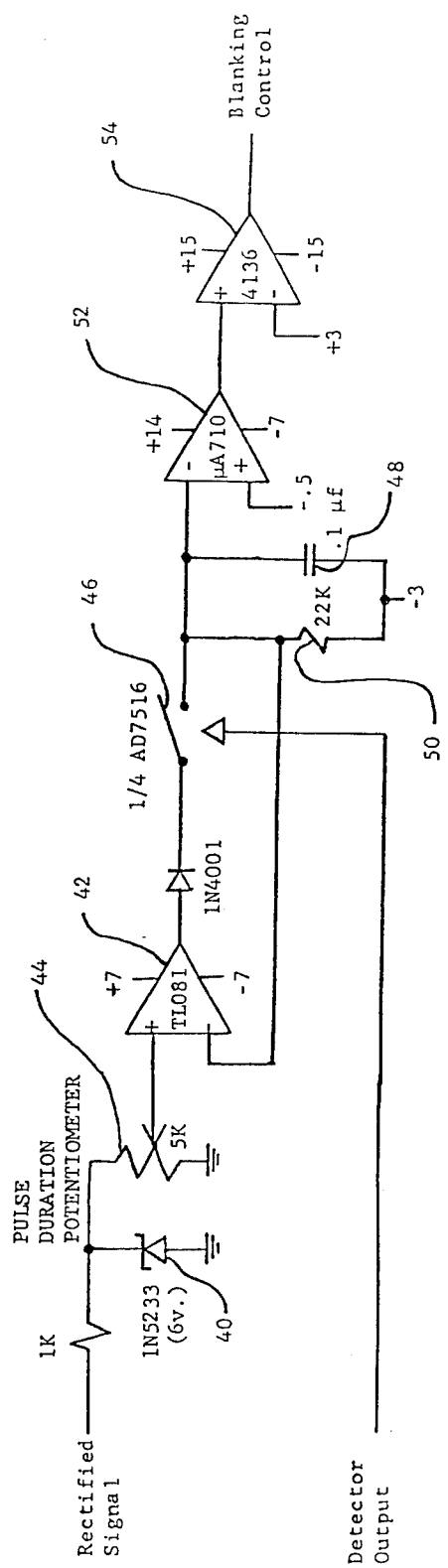
FIG. 4 is a general schematic of the blanking control circuitry of the embodiment of FIG. 1.

FIG. 4 contains a realization of the blanking control circuitry 14. The rectified signal from the absolute value circuit 26, is limited to 6 volts by zener diode 40 and then buffered at voltage follower 42. Potentiometer 44 adjusts the signal level present at the input of voltage follower 42, allowing the blanking duration to be adjusted to compensate for the varying high-frequency responses of different systems and the attendant different response of the various systems to impulse noise. The detector output of the impulse detection circuitry 12 controls analog switch 46 on the output of voltage follower 42. Switch 46 is closed upon detection of impulse noise, allowing the impulse to charge capacitor 48. Capacitor 48 discharges through resistor 50, hence, the value of resistor 50 determines the length of the blanking periods. As long as the voltage maintained by capacitor 48 at the inverting input of comparator 52 is greater than −0.5 volts, comparator 52 produces an output logic level which passes through level-shifting operational amplifier 54 to form the blanking control pulse. Through use of this circuit, the duration of the blanking control pulse is an increasing function of the amplitude of the impulse. The −0.5 volt level establishes a minimum blanking duration since upon detection of a small impulse with little energy, the capacitor will be pulled up to ground.

Figure 5:
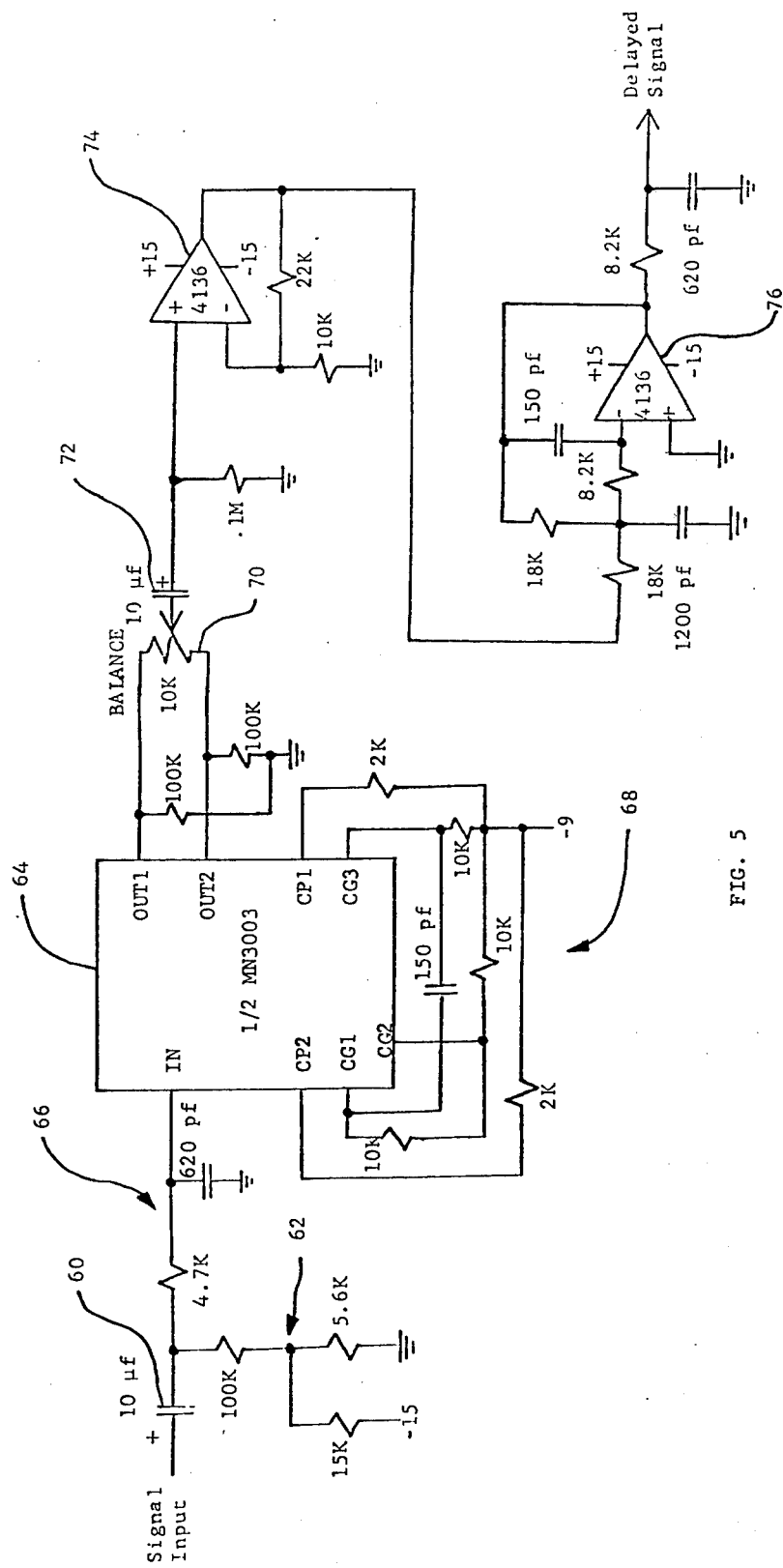
FIG. 5 is a general schematic of the signal delay circuitry of the embodiment of FIG. 1.

The signal delay circuitry 16 shown in FIG. 5. This circuit produces approximately a 0.5 millisecond delay in the input signal, providing sufficient time to detect and eliminate an impulse before it affects the output. Capacitor 60 and voltage divider 62 add a negative 4.2 volt bias to the input signal, placing it in the operating range of analog delay line 64. RC combination 66 on the input of delay line 64 provides an anti-aliasing low-pass filter with a pole around 55 kilohertz. Analog delay line 64 is a dual 64-stage bucket brigade delay line, operating at a clock frequency of approximately 200 kilohertz. Clock circuit 68 provides the required external components for the two-phase clock of the delay line 64. Balance potentiometer 70 on the output of the delay line assures proper recombination of the two components of the output. Capacitor 72 removes the DC bias added at capacitor 60 and voltage divider 62. Non-inverting amplifier 74 amplifies the output of the delay line by a factor of 3.2, returning the signal to its original level. Active filter 76 attenuates the high-frequency noise at the output of delay line 64. The filter is set to attenuate frequencies above 20 kilohertz.

Figure 6:
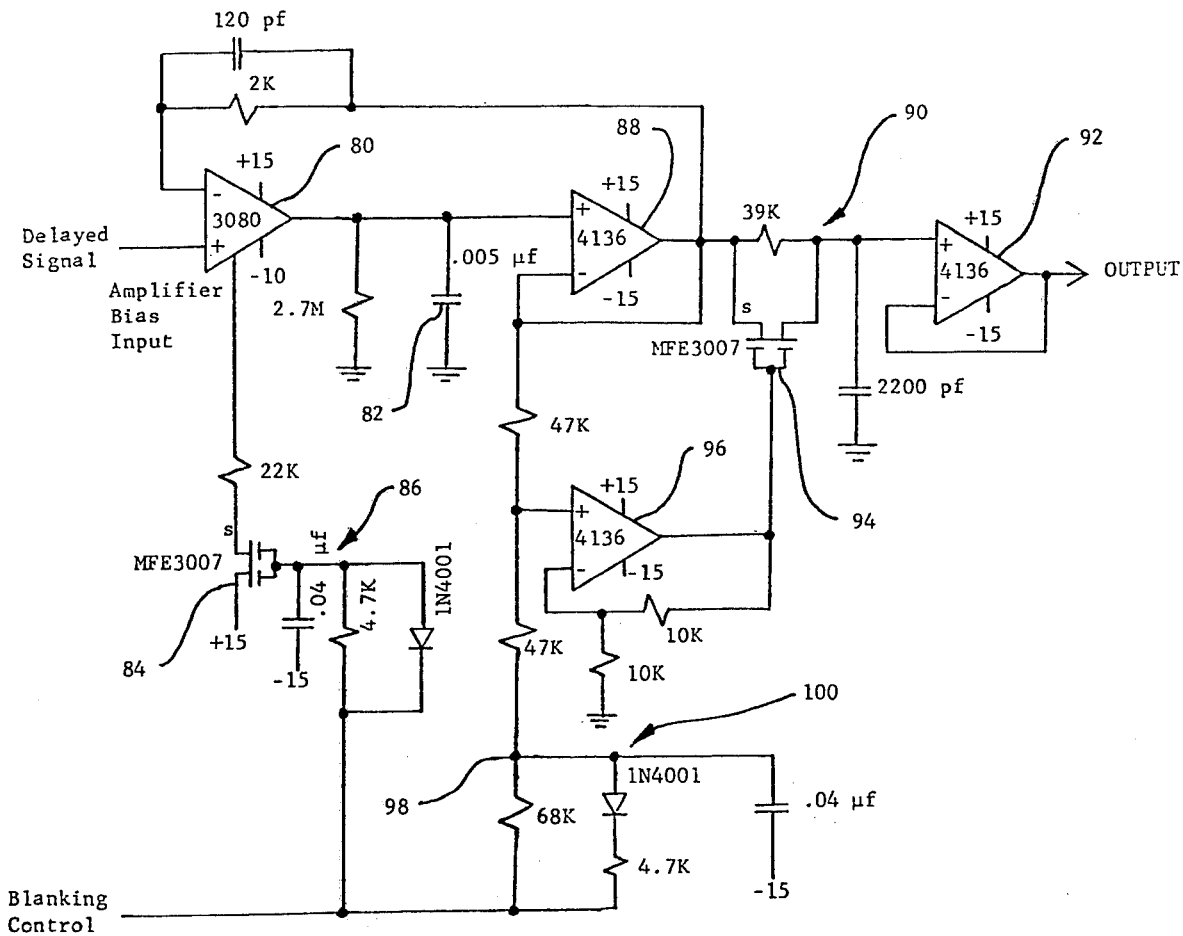
FIG. 6 is a general schematic of the impulse blanking circuitry of the embodiment of FIG. 1.

Impulse blanking circuitry 18 is shown in FIG. 6. The output of active filter 74 is buffered by operational transconductance amplifier (OTA) 80, whose output signal is formed on capacitor 82. The output of OTA 82 is proportional to the product of the bias current and the differential voltage on its inputs. MOSFET 84 controls the bias current of OTA 80 to limit its slew rate in response to a blanking control pulse. The negative-going blanking pulse causes the input bias current of OTA 80 to be cut off, holding the output of OTA 80 at its current value. RC combination 86 translates the rising and falling edges of the blanking control pulse into exponentials. The diode across the resistor in RC combination 86 causes the leading edge of the control signal to the gate of MOSFET 84 to be of shorter duration than the lagging edge. Hence, the slew rate of OTA 80 is disabled at a much faster rate than it is enabled. The output of OTA 80 is buffered at operational amplifier 88, passes through low-pass filter 90 and buffer 92 to the output. Low-pass filter 90 normally has a pole around 100 kilohertz. Normally-on n-channel MOSFET 94 turns off in reponse to the blanking control pulse and moves the pole of filter 90 down to around 500 hertz. Operational amplifier 96 acts to set the gate-source voltage of MOSFET 94 to the voltage between 98 and ground. RC combination 100 transforms the blanking control pulse into a signal with a short attack time and a long decay time. Thus, low-pass filter 90 is quickly enabled after the slew rate of OTA 80 is limited and gradually phased out after the impulse has passed and OTA 80 is allowed to slew again. This permits a smooth transition from the blanked signal to the input signal.

Since certain changes may be made in the foregoing specification and the accompanying drawings without departing from the scope of the present invention, it is intended that all matter of the present disclosure be interpreted in an illustrative and not in a limiting sense.

What is claimed is:

1. A system comprising:
   (a) means for accepting an input signal having audibly proper components and impulse noise components, said impulse noise components being of various sizes;
   (b) means responsive to said input signal for producing a transformed signal having attenuated audibly proper components and intensified impulse noise components;
   (c) means responsive to said transformed signal for producing an averaging signal characterized by instantaneous sizes that correspond to averaged sizes of predetermined time spans of said transformed signal;
   (d) means responsive synchronously to said transformed signal and said averaging signal for producing a detection signal having specified components, which are characterized by sizes that vary functionally with sizes of said impulse noise components;
   (e) means responsive to said detection signal for producing a control signal having blanking components characterized by varying time spans that are functionally related to said sizes of said specified components;
   (f) means responsive to said input signal for producing a time delayed signal corresponding to said audio signal; and
   (g) means responsive synchronously to said time delayed signal and said control signal for producing an improved audio signal.

2. The system of claim 1 wherein said means responsive to said input signal includes filter means for attenuation of relatively low frequencies of said audibly proper components and for emphasis for relatively high frequencies of said impulse noise components.

3. The system of claim 2 wherein said filter means is characterized by a lower frequency pole and a higher frequency pole.

4. The system of claim 3 wherein said lower frequency pole is located between one kilohertz and 10 kilohertz and said higher frequency pole is located at 20 kilohertz or above.

5. The system of claim 1 wherein said means responsive to said transformed signal includes means for rectifying said transformed signal.

6. The system of claim 1 wherein said means responsive to said transformed signal includes a capacitor and a non-zero impedance, said capacitor being charged by said transformed signal and being discharged through said non-zero impedance.

7. The system of claim 1 wherein said means responsive synchronously to said transformed signal and said averaging signal produces, in said detection signal, said specified components whenever the amplitude of said transformed signal exceeds the amplitude of said averaging signal by a pre-specified factor.

8. The system of claim 7 wherein said detection signal has detection components that vary functionally with varying sizes of said impulse noise components, the duration of any specified component being functionally related to the duration for which the amplitude of said transformed signal exceeds the amplitude of said averaging signal.

9. The system of claim 8 wherein said means responsive synchronously to said transformed signal and said averaging signal includes a variable impedance for adjusting the relative amplitudes of said transformed signal and said averaging signal for optimum response to the characteristics of said input signal.

10. The system of claim 7 wherein said means responsive to said detection signal includes means for establishing a minimum duration of any specified component of said detection signal.

11. The system of claim 1 wherein said means responsive synchronously to said time delayed signal and said control signal blanks said time delayed signal substantially for the durations of said impulse noise components.

12. The system of claim 1 wherein said means responsive synchronously to said time delayed signal and said control signal includes means for low pass filtering said time delayed signal only during transmission therethrough of said blanking components.

13. In a system for reducing noise in an audio signal at an input means by delaying the audio signal to produce a delayed signal, processing the audio signal to produce a control signal, and combining the delayed signal and the control signal to produce an improved signal at an output means, the improvement comprising:
   (a) filter means operatively connected to said input means for attenuating low frequencies of said audio signal;
   (b) differentiating means operatively connected to said input means for emphasizing relatively high frequencies of said audio signal;
   (c) rectifying means operatively connected to said filter means and said differentiating means for producing a rectified signal;
   (d) enveloping means operatively connected to said rectifying means for producing an enveloped signal;
   (e) comparing means operatively connected to said rectifying means and said enveloping means for producing a compared signal; and
   (f) blanking means operatively connected to said comparing means for producing a control signal having blanking components of time spans varying as a direct function of said noise.

14. The system of claim 13 wherein said filter means includes resistor-capacitor means with a pole located between one and 10 kilohertz.

15. The system of claim 13 wherein said differentiating means includes active filter means with a pole located at 20 kilohertz or above.

16. The system of claim 13 wherein said rectifying means includes twin operational amplifier means and twin diode means.

17. The system of claim 13 wherein said enveloping means includes operational amplifier means and diode means.

18. The system of claim 13 wherein said comparing means includes high gain amplifier means.

19. In a system for reducing noise in a substantially audio signal, said system comprising input means for reception of said substantially audio signal, delay means for delaying said substantially audio signal to produce a delayed signal, processing means for processing said substantially audio signal to produce a blanking signal, combining means for combining said delayed signal and said blanking signal to produce an improved signal, and output means for transmission of said improved signal, the improvement comprising:
   (a) resistor-capacitor means, with a pole located between one kilohertz and 10 kilohertz, operatively connected to said input means for high pass filtering frequencies of said substantially audio signal;

(b) amplifier means, including active filter means with a pole located at 20 kilohertz or above, operatively connected to said input means for differentiating frequencies of said substantially audio signal;

(c) twin-amplifier, twin-diode means operatively connected to said resistor-capacitor means and said amplifier means for producing a rectified signal;

(d) resistor-capacitor means operatively connected to said twin-amplifier, twin-diode means for producing a time-function signal;

(e) amplifier means operatively connected to said twin-amplifier, twin-diode means and to said last-mentioned resistor-capacitor means for producing a comparison signal; and (f) resistor-capacitor means operatively connected to said last-mentioned amplifer means for producing said blanking signal, said blanking signal having variable duration blanking pulses.

20. A system for reducing noise in a first input audio signal and a second input audio signal, said first input audio signal and said second input audio signal having audibly proper components and impulse noise components, said system comprising:

(a) first input buffer means for reception of said first input audio signal;

(b) first delay means responsive to said first input audio signal to produce a first delayed signal;

(c) second input buffer means for reception of said second input audio signal;

(d) second delay means responsive to said second input audio signal to produce a second delayed signal;

(e) impulse detection means including means responsive to said first input audio signal and said second input audio signal for producing a combined audio signal, means responsive to said combined audio signal for producing a transformed signal having attenuated audibly proper components and intensified impulse noise components, means responsive to said transformed signal for producing an averaging signal characterized by instantaneous sizes that correspond to averaged sizes of predetermined time spans of said transformed signal, means responsive synchronously to said transformed signal and said averaging signal for producing a detection signal having specified components, which are characterized by sizes that vary functionally with sizes of said impulse noise components;

(f) blanking control means including means responsive to said detection signal for producing a control signal having blanking components characterized by varying time spans that are functionally related to said sizes of said specified components;

(g) first impulse blanking means synchronously responsive to said control signal and said first delayed audio signal for producing a first improved audio signal; and (h) second impulse blanking means synchronously responsive to said control signal and said second delayed audio signal for producing a second improved audio signal.

21. A system for reducing impulse noise in an input signal characterized by audio intelligence, said system comprising:

(a) input means for reception of said input signal;

(b) high pass filter means operatively connected to said input means for attenuating low frequencies of said input signal;

(c) differentiating means operatively connected to said input means for emphasizing relatively high frequencies of said input signal;

(d) rectifying means operatively connected to said high pass filter means and said differentiating means for producing a rectified signal;

(e) averaging means operatively connected to said rectifying means for producing an averaging signal;

(f) comparing means operatively connected to said rectifying means and said averaging means for producing a compared signal;

(g) blanking means operatively connected to said comparing means for producing a control signal having blanking components of time spans varying as a direct function of the size of said noise;

(h) delay means operatively connected to said input means for producing a delayed audio signal; and (i) synchronous means operatively connected to said blanking means and said delay means for producing an improved signal characterized by audio intelligence.

22. A system for reducing impulse noise in an input signal characterized by audio intelligence, said system comprising:

(a) input means for reception of said input signal;

(b) high pass filter means including resistor-capacitor means operatively connected to said input means for attenuating low frequencies of said input signal;

(c) differentiating means including operational amplifier means operatively connected to said input means for emphasizing relatively high frequencies of said input signal;

(d) rectifying means including twin-amplifier, twin-diode means operatively connected to said high pass filter means and said differentiating means for producing a rectified signal;

(e) averaging means including amplifier and diode means operatively connected to said rectifying means for producing an averaging signal;

(f) comparing means including high gain amplifier means operatively connected to said rectifying means and said averaging means for producing a compared signal;

(g) blanking means including resistor-capacitor means operatively connected to said comparing means for producing a control signal having blanking components of time spans varying as a direct function of the size of said noise;

(h) delay means operatively connected to said input means for producing a delayed input signal; and (i) synchronous means operatively connected to said blanking means and said delay means for producing an improved signal characterized by said audio intelligence.

23. The system of claim 22 wherein said comparing means produces, in said compared signal, noise designating components whenever the amplitude of said rectified signal exceeds the amplitude of said averaging signal by a prespecified factor.

24. The system of claim 22 wherein said compared signal has detection components that vary functionally with varying sizes of said impulse noise, the duration of any noise designating component being functionally related to the duration for which the amplitude of said rectified signal exceeds the amplitude of said averaging signal.

25. The system of claim 22 wherein said comparing means includes a variable impedance for adjusting the relative amplitudes of said rectified signal and said averaging signal for optimum response to the characteristics of said input signal.

26. The system of claim 22 wherein said blanking means includes means for establishing a minimum duration of any specified noise designating component.

27. The system of claim 22 wherein said synchronous means blanks said time delayed signal substantially for the durations of said impulse noise.

28. The system of claim 22 wherein said synchronous means includes means for low pass filtering said time delayed signal only during transmission therethrough of any noise designating components.

29. The system of claim 22 wherein said high pass filter means is characterized by a pole located between one kilohertz and 10 kilohertz and said differentiating means includes active filter means with a pole located at 20 kilohertz or above.

* * * * *